US008225269B2

(12) United States Patent
Balaram et al.

(10) Patent No.: US 8,225,269 B2
(45) Date of Patent: Jul. 17, 2012

(54) TECHNIQUE FOR GENERATING AN ANALYSIS EQUATION

(75) Inventors: Anil P. Balaram, Nepean (CA); Kristin M. Beggs, Oviedo, FL (US); Barry A. Giffel, Wake Forest, NC (US); Guy M. Morency, Chapel Hill, NC (US)

(73) Assignee: Synopsys, Inc., Mountain View, CA (US)

( * ) Notice: Subject to any disclaimer, the term of this patent is extended or adjusted under 35 U.S.C. 154(b) by 347 days.

(21) Appl. No.: 12/609,572

(22) Filed: Oct. 30, 2009

(65) Prior Publication Data

US 2011/0107252 A1    May 5, 2011

(51) Int. Cl.
*G06F 17/50*    (2006.01)
(52) U.S. Cl. ............. 716/139; 716/102; 716/136; 703/2
(58) Field of Classification Search ........................ None
See application file for complete search history.

(56) References Cited

U.S. PATENT DOCUMENTS

| | | | | |
|---|---|---|---|---|
| 4,656,603 A * | 4/1987 | Dunn | ............................ | 715/835 |
| 4,813,013 A * | 3/1989 | Dunn | ............................ | 715/763 |
| 5,222,030 A * | 6/1993 | Dangelo et al. | ............... | 716/102 |
| 5,258,919 A * | 11/1993 | Yamanouchi et al. | ........ | 716/103 |
| 5,265,040 A * | 11/1993 | Saji et al. | ......................... | 716/51 |
| 5,428,550 A * | 6/1995 | Covey et al. | ................... | 716/103 |
| 5,479,593 A * | 12/1995 | Brewer et al. | .................. | 345/441 |
| 5,493,508 A * | 2/1996 | Dangelo et al. | ............... | 716/103 |
| 5,963,724 A * | 10/1999 | Mantooth et al. | ............... | 703/14 |
| 6,175,949 B1 * | 1/2001 | Gristede et al. | ............... | 716/135 |
| 6,219,822 B1 * | 4/2001 | Gristede et al. | ............... | 716/113 |
| 6,236,956 B1 * | 5/2001 | Mantooth et al. | ............... | 703/14 |
| 6,643,836 B2 * | 11/2003 | Wheeler et al. | ............... | 716/102 |
| 7,228,509 B1 * | 6/2007 | Dada et al. | ...................... | 716/102 |
| 7,386,833 B2 * | 6/2008 | Granny et al. | ................. | 717/109 |
| 7,793,241 B2 * | 9/2010 | Tai et al. | ......................... | 716/115 |
| 7,797,654 B2 * | 9/2010 | Tai et al. | ......................... | 716/111 |
| 2006/0230377 A1 * | 10/2006 | Rapp et al. | ....................... | 716/18 |
| 2009/0089024 A1 * | 4/2009 | Huang et al. | ...................... | 703/2 |

OTHER PUBLICATIONS

Hood et al., "The Design Analysis for Reliability Tool," pp. 1462-1467, no date.*
Owczarek et al., "Design of Graphical User Interface (GUI) for Analog EDA Tool," TCSET'2004, Feb. 24-28, 2004, Lviv-Slavsko, Ukraine, pp. 560-562.*

\* cited by examiner

*Primary Examiner* — Leigh Garbowski
(74) *Attorney, Agent, or Firm* — Park, Vaughan, Fleming & Dowler LLP; Laxman Sahasrabuddhe (57) ABSTRACT

During a method, a hybrid graphical user interface (GUI), which is associated with electronic-design-automation (EDA) software, is displayed. This hybrid GUI allows users to efficiently specify useful analysis equations using textual and/or graphical information. In particular, the hybrid GUI has a first window that includes graphical objects associated with a circuit design. A user can select one or more of the graphical objects and associated electrical parameters using a user-interface device, such as a mouse. The hybrid GUI has a second window that has icons and other graphical controls that allow the construction of an analysis equation using the user-interface device. In addition, the hybrid GUI has a third window that includes an equation editor that provides a symbolic representation of an analysis equation based at least on one or more text entries provided by a user using a second user-interface device (such as a keyboard) and/or user selections of a given graphical object in the graphical objects and an associated electrical parameter.

20 Claims, 5 Drawing Sheets

FIG. 1

METHOD
200

```
DISPLAY A FIRST WINDOW IN A GUI ASSOCIATED WITH AN EDA ENVIRONMENT,
WHERE THE FIRST WINDOW INCLUDES ONE OR MORE GRAPHICAL OBJECTS
ASSOCIATED WITH A CIRCUIT DESIGN, AND WHERE THE ONE OR MORE
GRAPHICAL OBJECTS AND ASSOCIATED ELECTRICAL PARAMETERS CAN BE
SELECTED BY A USER USING A FIRST USER-INTERFACE DEVICE
210
```

```
DISPLAY ADDITIONAL INFORMATION IF A USER SELECTS A GIVEN GRAPHICAL
OBJECT, WHERE THE ADDITIONAL INFORMATION ALLOWS THE USER TO SELECT
AN ELECTRICAL PARAMETER ASSOCIATED WITH THE GIVEN GRAPHICAL
OBJECT
(OPTIONAL)
212
```

```
DISPLAY A SECOND WINDOW IN THE GUI, WHERE THE SECOND WINDOW
INCLUDES ANALYSIS OPERATIONS THAT CAN BE SELECTED BY THE USER
214
```

```
DISPLAY A THIRD WINDOW IN THE GUI, WHERE THE THIRD WINDOW INCLUDES
AN EQUATION EDITOR THAT PROVIDES A SYMBOLIC REPRESENTATION OF AN
ANALYSIS EQUATION, BASED AT LEAST ON ONE OR MORE TEXT ENTRIES
PROVIDED BY THE USER USING A SECOND USER-INTERFACE DEVICE, USER
SELECTIONS OF THE GIVEN GRAPHICAL OBJECT AND THE ASSOCIATED
ELECTRICAL PARAMETER, AND/OR USER SELECTIONS OF AN ANALYSIS
OPERATION
216
```

TECHNIQUE FOR GENERATING AN ANALYSIS EQUATION

BACKGROUND

1. Field

This disclosure generally relates to a technique for generating analysis equations. More specifically, this invention relates to a technique for generating an analysis equation for use in processing results of electronic-design-automation software.

2. Related Art

Electronic-design-automation (EDA) software is routinely used during circuit design and validation. After performing simulations, users of EDA software often post process output waveforms using user-supplied analysis equations, which are typically provided or specified using a user interface. For example, in some existing EDA user interfaces users can provide an analysis equation by typing commands in a calculator-style equation editor using a user-interface device, such as a keyboard. Alternatively, in other existing EDA user interfaces users can select an analysis equation by selecting graphical objects that are displayed in a graphical user interface (GUI), for example, in a so-called 'wizard-style' interface.

However, each of these existing approaches can be difficult to use. For example, in order to use an equation editor, users typically must first learn the allowed commands and the associated syntax. Furthermore, there are usually constraints on the number of available graphical objects or guided flows in a wizard-style interface. This often restricts the types of analysis equations that users can select or specify.

Consequently, it can be difficult and time-consuming for users to specify useful analysis equations in existing EDA software, which can reduce customer satisfaction, and adversely impact customer retention and sales.

SUMMARY

One embodiment of the present disclosure provides a computer system that generates an analysis equation in an electronic-design-automation (EDA) environment. During operation, the computer system displays a first window in a graphical user interface (GUI) associated with the EDA environment, where the first window includes one or more graphical objects associated with a circuit design, and where the one or more graphical objects and associated electrical parameters can be selected by a user using a first user-interface device. Then, the computer system displays a second window in the GUI, where the second window includes analysis operations that can be selected by the user. Next, the computer system displays a third window in the GUI, where the third window includes an equation editor that provides a symbolic representation of the analysis equation based at least on one or more text entries provided by a user using a second user-interface device, user selections of a given graphical object in the one or more graphical objects and an associated electrical parameter, and an analysis operation, thereby facilitating user definition of the analysis equation using textual and/or graphical information.

Note that the first user-interface device may include a mouse, and the given graphical object may be selected by performing one or more mouse clicks proximate to the given graphical object. Furthermore, the electrical parameter may be inferred based at least on a position of a cursor in the first window when the user selects the given graphical object. Additionally, the second user-interface device may include a keyboard, which can be a physical keyboard or a virtual keyboard, and the one or more text entries may be provided by the user by activating one or more icons or keys on the keyboard.

In some embodiments, the analysis equation is used to process previous results of one or more electrical simulations performed in the EDA environment. For example, the analysis equation may include one or more analysis operations to be performed on electrical signals associated with the circuit design.

Furthermore, the graphical objects may include one or more nets in the circuit design having associated terminals. Consequently, the given graphical object may include a net or a terminal, and the associated electrical parameter may include a voltage associated with the net or a current through the terminal.

In some embodiments, the computer system displays additional information if the user selects the given graphical object, where the additional information allows the user to select the electrical parameter associated with the given graphical object. For example, the additional information may be presented in a drop-down menu.

Note that each analysis operation in the second window may represent a tailored approach to graphical object selection, which may require the user to select sequentially one or more graphical objects. For each successive pending selection from the given graphical objects, the user may be prompted to select a single graphical object with a type that is a member of group of types. After the set of required graphical object selections is complete, an analysis equation with a format specific to the selected analysis operation may be generated. This analysis equation may contain one or more electrical parameters associated either directly or indirectly with the user selected graphical objects.

For example, if the given graphical object includes the net or the terminal, and the associated electrical parameter includes the voltage associated with the net or the current through the terminal, the analysis equation may determine power based at least on the voltage and the current using a power-computation operation selected by the user from the analysis operations in the second window. Alternatively, if the given graphical object includes the net in the circuit design and the associated electrical parameter includes an electrical signal in the net, the analysis equation may determine frequency-domain information associated with the electrical signal using a Fourier-transform operation selected by the user from the analysis operations in the second window. Additionally, if the given graphical object includes two locations in the circuit design, the analysis equation may determine an impedance between the locations using an impedance operation selected by the user from the analysis operations in the second window.

Another embodiment provides a method including at least some of the above-described operations.

Another embodiment provides a computer-program product (such as the computer software) for use in conjunction with the computer system.

Another embodiment provides the GUI, which includes the first window, the second window and the third window.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a computer system, a method, and a computer-program product (i.e., software) for use with the computer system are described. During the method, a hybrid graphical user interface (GUI), which is associated with electronic-design-automation (EDA) software, is displayed. This hybrid GUI allows users to efficiently specify useful analysis equations. In particular, the hybrid GUI has a first window that includes graphical objects associated with a circuit design. A user can select one or more of the graphical objects and associated electrical parameters using a user-interface device, such as a mouse. The hybrid GUI has a second window that has icons and other graphical controls that allow the construction of an analysis equation using the user-interface device. In addition, the hybrid GUI has a third window that includes an equation editor that provides a symbolic representation of an analysis equation based at least on one or more text entries provided by a user using a second user-interface device (such as a keyboard) and/or user selections of a given graphical object in the graphical objects and an associated electrical parameter.

By facilitating user definition of the analysis equation using textual and/or graphical information, the hybrid GUI can make it easier for users to use the EDA software, for example, by reducing the time and effort needed to specify analysis equations and to learn the commands and syntax associated with the equation editor. Consequently, the hybrid GUI can: improve the user experience, increase customer satisfaction, and improve customer retention and sales.

In the discussion that follows, the technique for generating an analysis equation is applied to EDA software as an illustrative example. However, this technique may be used in conjunction with a wide variety of software, including: software applications, software development tools, firmware, operating systems and/or software testing tools.

Figure 1:
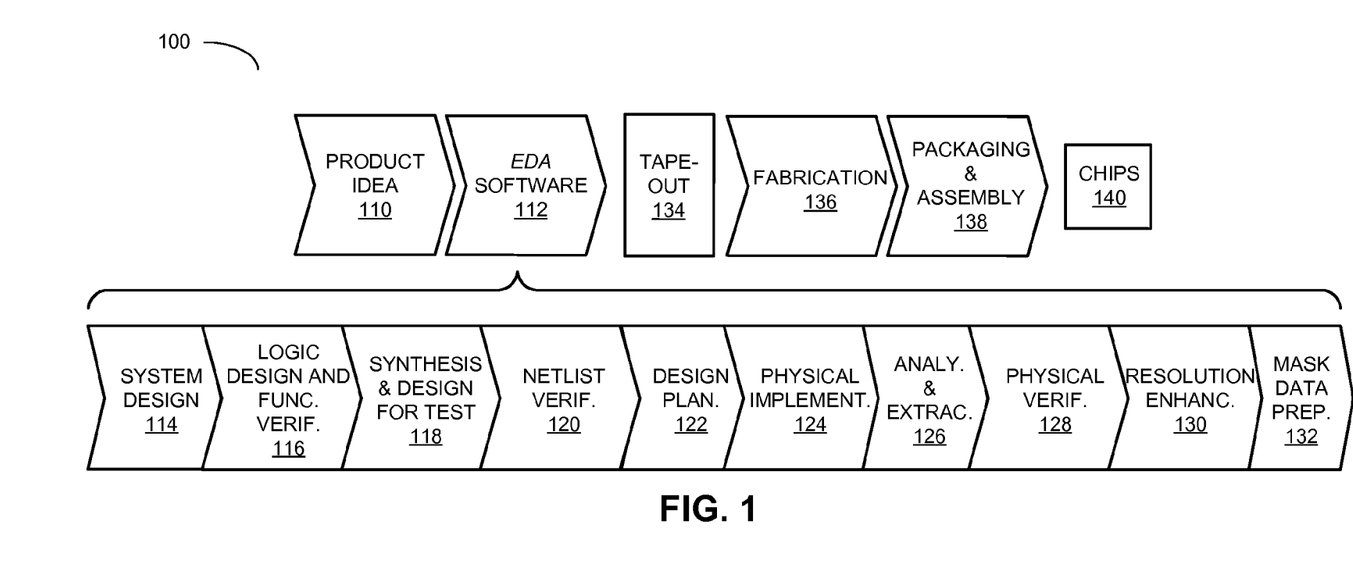
FIG. 1 is a flowchart illustrating various operations in the design and fabrication of an integrated circuit in accordance with an embodiment of the present disclosure.

We now describe embodiments of design and fabrication of integrated circuits or chips. FIG. 1 presents a flowchart 100 illustrating the various operations in the design and fabrication of an integrated circuit. This process starts with the generation of a product idea (110), which is realized during a design process that uses EDA software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below. This design flow description is for illustration purposes only. In particular, this description is not meant to limit the present disclosure. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect®, Saber®, System Studio®, and Designware® products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS®, Vera®, Designware®, Magellan®, Formality®, ESP® and Leda® products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality®, Primetime®, and VCS® products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro® and IC Compiler® products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro® and IC Compiler® products.

Then, during analysis and extraction (126), the circuit function is verified at a transistor level, which permits refinement. Exemplary EDA software products from Synopsys, Inc. of Mountain View, Calif. that can be used at this stage include: Astrorail®, Primerail®, Primetime®, and Star RC/XT® products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules® product.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus®, Proteus®AF, and PSMGED® products.

Additionally, during mask-data preparation (132), the 'tape-out' data for production of masks to produce finished chips is provided. Exemplary EDA software products from Synopsys, Inc. of Mountain View, Calif. that can be used at this stage include the Cats® family of products.

Embodiments of the present disclosure can be used during one or more of the above-described stages. Specifically, in some embodiments the present disclosure can be used in EDA software 112, which may provide a custom schematic editor and simulation environment.

Figure 2:
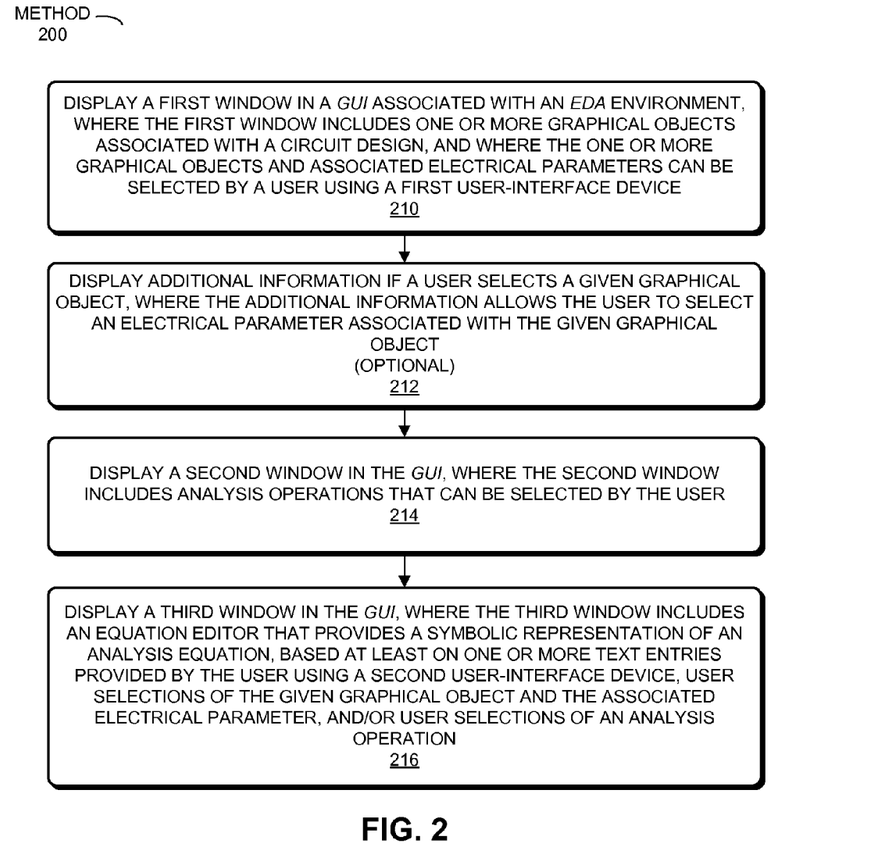
FIG. 2 is a flowchart illustrating a method for generating an analysis equation in an electronic-design-automation (EDA) environment in accordance with an embodiment of the present disclosure.

We now describe embodiments of a technique for generating an analysis equation in an EDA environment. FIG. 2 presents a flowchart illustrating a method 200 for generating an analysis equation in an EDA environment, which may be performed by a computer system (such as computer system 400 in FIG. 4). During operation, the computer system displays a first window in a GUI associated with the EDA environment (operation 210), where the first window includes one or more graphical objects associated with a circuit design, and where the one or more graphical objects and associated electrical parameters can be selected by a user using a first user-interface device. Then, the computer system displays a second window in the GUI (operation 214), where the second window includes analysis operations that can be selected by the user. Next, the computer system displays a third window in the GUI (operation 216), where the third window includes an equation editor that provides a symbolic representation of the analysis equation based at least on one or more text entries provided by a user using a second user-interface device, user selections of a given graphical object in the one or more graphical objects and an associated electrical parameter, and/or an analysis operation, thereby facilitating user definition of the analysis equation using textual and/or graphical information.

Note that the first user-interface device may include a mouse, and the given graphical object may be selected by performing one or more mouse clicks proximate to the given graphical object. Furthermore, the electrical parameter may be inferred based at least on a position of a cursor in the first window when the user selects the given graphical object. Additionally, the second user-interface device may include a keyboard, which can be a physical keyboard or a virtual keyboard, and the one or more text entries may be provided by the user by activating one or more icons or keys on the keyboard.

In some embodiments, the analysis equation is used to process previous results of one or more electrical simulations performed in the EDA environment. For example, the analysis equation may include one or more analysis operations to be performed on electrical signals associated with the circuit design.

Furthermore, the graphical objects may include one or more nets in the circuit design having associated terminals. Consequently, the given graphical object may include a net or a terminal, and the associated electrical parameter may include a voltage associated with the net or a current through the terminal.

In some embodiments, the computer system optionally displays additional information if the user selects the given graphical object (operation 212), where the additional information allows the user to select the electrical parameter associated with the given graphical object. For example, the additional information may be presented in a drop-down menu.

Note that each analysis operation in the second window may represent a tailored approach to graphical object selection, which may require the user to select sequentially one or more graphical objects. For each successive pending selection from the given graphical objects, the user may be prompted to select a single graphical object with a type that is a member of group of types. After the set of required graphical object selections is complete, an analysis equation with a format specific to the selected analysis operation may be generated. This analysis equation may contain one or more electrical parameters associated either directly or indirectly with the user selected graphical objects.

For example, if the given graphical object includes the net or the terminal, and the associated electrical parameter includes the voltage associated with the net or the current through the terminal, the analysis equation may determine power based at least on the voltage and the current using a power-computation operation selected by the user from the analysis operations in the second window. Alternatively, if the given graphical object includes the net in the circuit design and the associated electrical parameter includes an electrical signal in the net, the analysis equation may determine frequency-domain information associated with the electrical signal using a Fourier-transform operation selected by the user from the analysis operations in the second window. Additionally, if the given graphical object includes two locations in the circuit design, the analysis equation may determine an impedance between the locations using an impedance operation selected by the user from the analysis operations in the second window.

Furthermore, user selected graphical objects may not be a net or its associated terminal, but instead may contain none or more terminals and their associated nets. Consequently, the given graphical object may have associated electrical parameters of power and/or other electrical operation information. Additionally, any given graphical object may not have its associated electrical parameters directly referenced within the generated analysis equation. The given graphical object may be used to extract one or more associated graphical objects that are used to retrieve associated electrical parameters, which are used within the generated analysis. Thus, a user selected object may in turn be used to seek other related objects from which their associated electrical parameters are used in the one or more generated equations. For example, a user may select an instance with the intent of generating one or more equations associated with the terminal currents and/or net voltages connected to the instance. Alternatively, the user may select a net object with the intent of generating one or more equations for either the terminal currents associated with the net or electrical parameters of instances with terminals associated with the net. Moreover, the user may select a terminal with the intent of generating one or more equations for either the net voltage associated with the terminal or electrical parameters of the instance containing the selected terminal.

In some embodiments of method 200 there are additional or fewer operations. Moreover, the order of the operations may be changed and/or two or more operations may be combined into a single operation.

Figure 3:
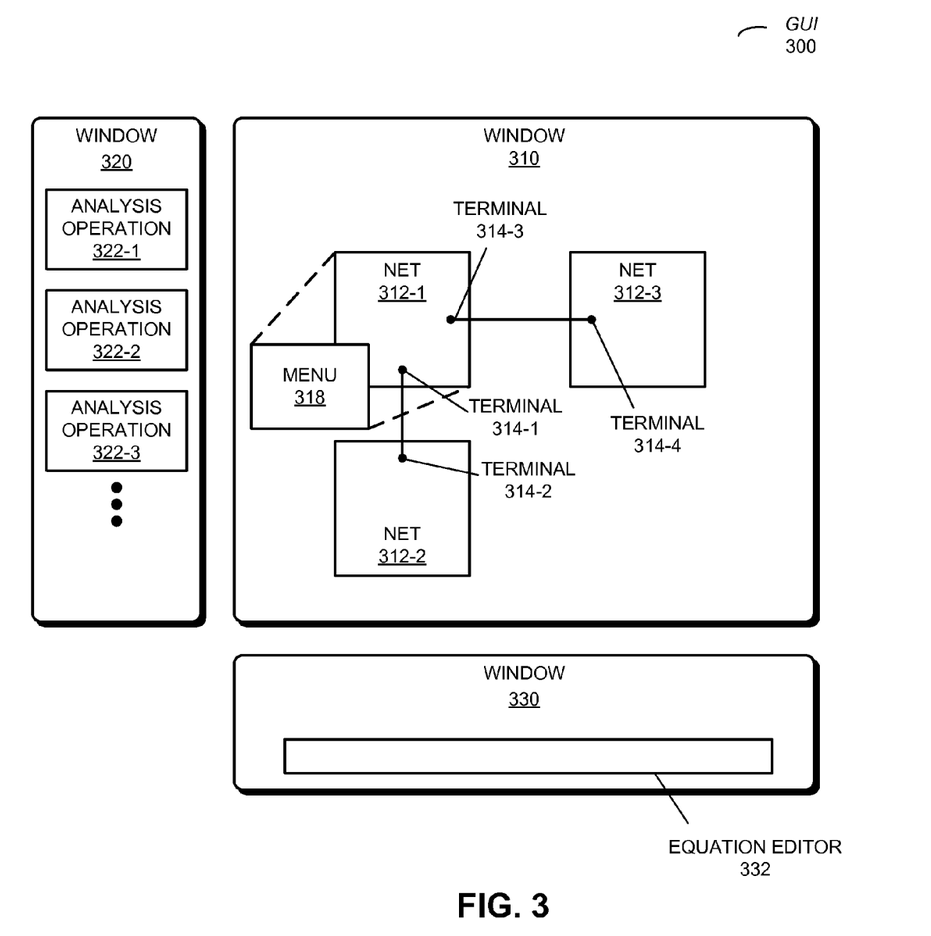
FIG. 3 is a graphical user interface (GUI) associated with the EDA environment in accordance with an embodiment of the present disclosure.

We now describe embodiments of the GUI. FIG. 3 presents a GUI 300 associated with the EDA environment. This GUI has a window 310, which includes multiple graphical objects, such as nets 312 and terminals 314 in a circuit design. A user may select one or more of the graphical objects, for example, by clicking on or proximate to the one or more graphical objects using a user-interface device (such as a mouse).

In response, the user selections are displayed in window 330, which includes equation editor 332. In particular, software may populate or fill in an analysis equation in equation editor 332 based at least on the user selections. Alternately or additionally, the analysis equation may be based at least on textual information provided by the user using another user-interface device, such as a physical or a virtual keyboard. Subsequently, users can modify any defaults in the analysis equation, such as the number of harmonics included in a Fourier transform analysis operation.

Note that, using GUI 300, the user may be able to specify the analysis equation without consulting a manual. For example, by displaying the analysis-equation consequences of the user selections, GUI 300 helps users learn the commands and syntax associated with equation editor 332 in window 330. Subsequently, the user can use this knowledge to modify an existing analysis equation or to type in a new analysis equation using equation editor 332 and the physical or virtual keyboard. Therefore, GUI 300 facilitates user selection of guided flows (via window 310) for analyzing simulation data and provides a powerful language for doing the same thing (via equation editor 332 in window 330) with a seamless transition between the two, thereby allowing the user to learn the language.

For example, the user can click on a graphical object, such as net 312-1, using the mouse. In response, GUI 300 may display tags for electrical parameters (such as variables, properties and/or characteristics of one or more waveforms) in a drop-down menu 318, which the user can use to make additional selections. The user can also select analysis operations 322 from window 320 (such as a graphical guided expression-building window, which is sometimes referred to as a plot-assist/calculate-table window). These selections, as well as any textual information entered using the physical or virtual keyboard, are then displayed symbolically in equation editor 332 in window 330. Note that entries display in window 320 may be based on user selection of one or more graphical objects in window 310 and/or using a set of predefined analysis operations.

Alternatively or additionally, the electrical properties may be specified by the user based at least on the location where the user clicks in window 310, i.e., the information populated into equation editor 332 may be context sensitive. For example, an electrical parameter may be inferred based at least on a position of a cursor in window 310 when the user selects a given graphical object. Thus, if the user clicks on the body of net 312-1, a voltage may be specified, and if the user clicks on terminal 314-1 in net 312-1, a current may be specified.

In summary, the combination of and seamless interaction between windows 310 and 330 in GUI 300 may provide more flexibility for the user in specifying one or more analysis equations than a GUI that only includes either one of these windows.

Figure 4:
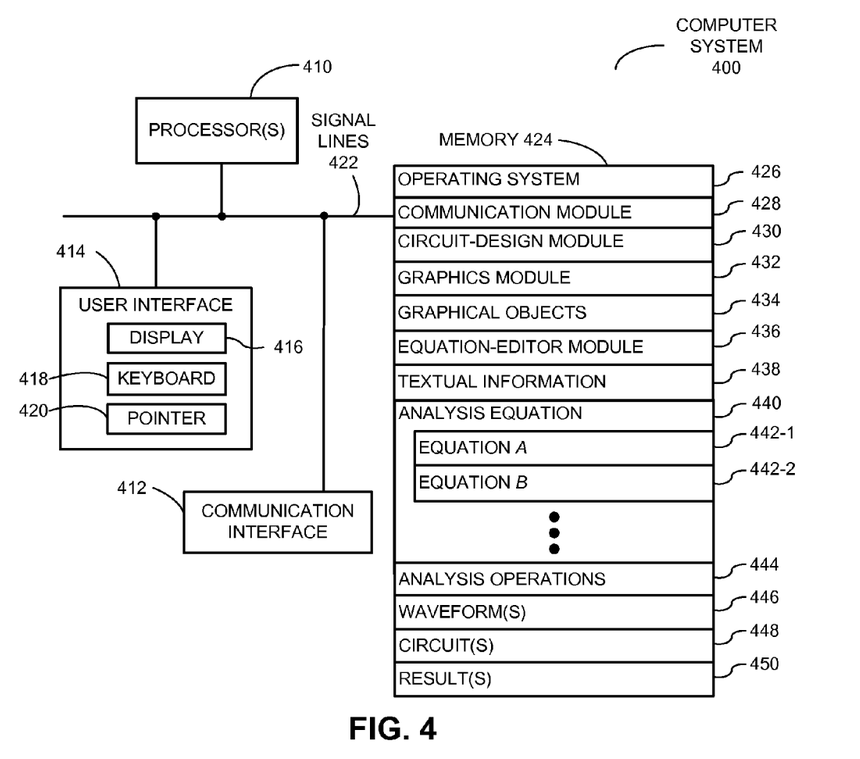
FIG. 4 is a block diagram illustrating a computer system that performs the method of FIG. 2 in accordance with an embodiment of the present disclosure.

We now describe embodiments of a computer system that selects an object. FIG. 4 presents a block diagram illustrating a computer system 400 that performs method 200 (FIG. 2). Computer system 400 includes: one or more processors 410 (thus, the 'processor' in the preceding discussion should be understood to include one or more processors or processor cores), a communication interface 412, a user interface 414, and one or more signal lines 422 coupling these components together. Note that the one or more processors 410 may support parallel processing and/or multi-threaded operation, the communication interface 412 may have a persistent communication connection, and the one or more signal lines 422 may constitute a communication bus. Moreover, the user interface 414 may include: a display 416, a keyboard 418, and/or a pointer 420, such as a mouse.

Memory 424 in computer system 400 may include volatile memory and/or non-volatile memory. More specifically, memory 424 may include: ROM, RAM, EPROM, EEPROM, flash, one or more smart cards, one or more magnetic disc storage devices, and/or one or more optical storage devices. Memory 424 may store an operating system 426 that includes procedures (or a set of instructions) for handling various basic system services for performing hardware-dependent tasks. Memory 424 may also store procedures (or a set of instructions) in a communication module 428. These communication procedures may be used for communicating with one or more computers and/or servers, including computers and/or servers that are remotely located with respect to computer system 400.

Memory 424 may also include multiple program modules (or sets of instructions), including: circuit-design module 430 (or a set of instructions), graphics module 432 (or a set of instructions) and/or equation-editor module 436 (or a set of instructions). Note that one or more of these program modules (or sets of instructions) may constitute a computer-program mechanism.

During operation, graphics module 432 may display a hybrid GUI on display 416. This hybrid GUI may include a first window with graphical objects 434 (which are associated with one or more circuits 448), a second window with analysis operations 444 that the user can select using pointer 420, and a third window with equation-editor module 436. A user may specify one or more analysis equations 440, such as equation A 442-1 and equation B 442-2, by selecting one or more of graphical objects 434 in the first window using pointer 420, by selecting one or more of analysis operation 444 using pointer 420, and/or by providing textual information 438 using keyboard 418. Note that selected graphical objects, entered textual information and/or selected analysis operations may be populated into equation-editor module 436 and/or saved as one or more of analysis equations 440.

Additionally, the user-specified analysis equations 440 may be used to processes waveforms 446 that are generated during simulations of circuits 448 using circuit-design module 430. This processing may determine one or more results 450.

Instructions in the various modules in the memory 424 may be implemented in: a high-level procedural language, an object-oriented programming language, and/or in an assembly or machine language. Note that the programming language may be compiled or interpreted, e.g., configurable or configured, to be executed by the one or more processing units 410.

Computer system 400 may include a variety of devices, such as: a personal computer, a laptop computer, a server, a work station, a mainframe computer, and/or other device capable of manipulating computer-readable data.

Although computer system 400 is illustrated as having a number of discrete items, FIG. 4 is intended to be a functional description of the various features that may be present in computer system 400 rather than a structural schematic of the embodiments described herein. In practice, and as recognized by those of ordinary skill in the art, the functions of computer system 400 may be distributed over a large number of servers or computers, with various groups of the servers or computers performing particular subsets of the functions. Consequently, computer system 400 may be at one location or may be distributed across multiple locations, such as computing systems that communicate via a network (such as the Internet or an intranet).

In some embodiments, some or all of the functionality of computer system 400 may be implemented in one or more: application-specific integrated circuit (ASICs), field-programmable gate array (FPGAs), and/or one or more digital signal processors (DSPs). Note that the functionality of computer system 400 may be implemented more in hardware and less in software, or less in hardware and more in software, as is known in the art.

Figure 5:
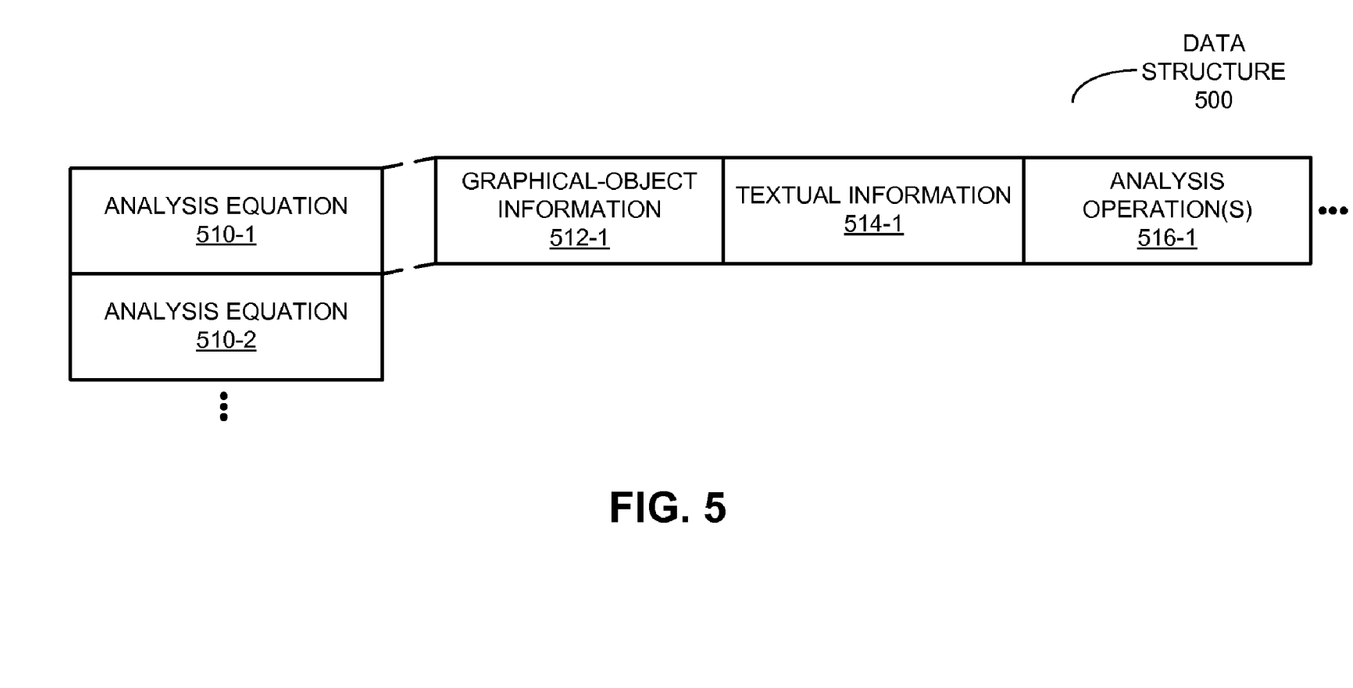
FIG. 5 is a block diagram illustrating a data structure for use in conjunction with the computer system of FIG. 4 in accordance with an embodiment of the present disclosure.

We now discuss embodiments of data structures that may be used in computer system 400. FIG. 5 presents a block diagram illustrating a data structure 500. This data structure may include one or more analysis equations 510, which may be specified by a user using a hybrid GUI (such as GUI 300 in FIG. 3). For example, analysis equation 510-1 may include: graphical-object information 512-1, textual information 514-1 and/or one or more analysis operations 516-1.

In some embodiments, GUI 300 (FIG. 3), computer system 400 (FIG. 4) and/or data structure 500 include fewer or additional components. Moreover, two or more components may be combined into a single component and/or a position of one or more components may be changed.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A computer-implemented method for generating an analysis equation in an electronic-design-automation (EDA) environment, comprising:
    using one or more processors to display a first window in a graphical user interface (GUI) associated with the EDA environment, wherein the first window includes one or more graphical objects associated with a circuit design, and wherein the one or more graphical objects and associated electrical parameters are configured to be selected by a user using a first user-interface device;
    using the one or more processors to display a second window in the GUI, wherein the second window includes analysis operations that can be selected by the user;
    using the one or more processors to display a third window in the GUI, wherein the third window includes an equation editor;
    receiving a selection of one or more graphical objects and associated electrical parameters from the user;
    receiving a selection of an analysis operation from the user; and
    populating a symbolic representation of the analysis equation in the equation editor based on the selection of one or more graphical objects and associated electrical parameters and the selection of the analysis operation.

2. The computer-implemented method of claim 1, wherein the first user-interface device includes a mouse; and
    wherein the given graphical object is selected by performing one or more mouse clicks proximate to the given graphical object.

3. The computer-implemented method of claim 2, wherein the electrical parameter is inferred based at least on a position of a cursor in the first window when the user selects the given graphical object.

4. The computer-implemented method of claim 1, wherein the second user-interface device includes a keyboard, which can be a physical keyboard or a virtual keyboard; and
    wherein the one or more text entries are provided by the user by activating one or more icons or keys on the keyboard.

5. The computer-implemented method of claim 1, wherein the analysis equation is used to process previous results of one or more electrical simulations performed in the EDA environment.

6. The computer-implemented method of claim 1, wherein the analysis equation includes one or more analysis operations to be performed on electrical signals associated with the circuit design.

7. The computer-implemented method of claim 1, wherein the graphical objects include one or more nets in the circuit design having associated terminals.

8. The computer-implemented method of claim 7, wherein the given graphical object includes a net or a terminal; and
    wherein the associated electrical parameter includes a voltage associated with the net or a current through the terminal.

9. The computer-implemented method of claim 1, the method further including using the one or more processors to display additional information if the user selects the given graphical object, wherein the additional information allows the user to select the electrical parameter associated with the given graphical object.

10. The computer-implemented method of claim 9, wherein the additional information is presented in a drop-down menu.

11. The computer-implemented method of claim 1, wherein the given graphical object includes a net in the circuit design and the associated electrical parameter includes a voltage on the net and a current through a terminal in the net; and
    wherein the analysis equation determines power based at least on the voltage and the current using a power-computation operation selected by the user from the analysis operations in the second window.

12. The computer-implemented method of claim 1, wherein the given graphical object includes a net in the circuit design and the associated electrical parameter includes an electrical signal in the net; and
    wherein the analysis equation determines frequency-domain information associated with the electrical signal using a Fourier-transform operation selected by the user from the analysis operations in the second window.

13. The computer-implemented method of claim 1, wherein the given graphical object includes two locations in the circuit design; and
    wherein the analysis equation determines an impedance between the locations using an impedance operation selected by the user from the analysis operations in the second window.

14. A computer-program product for use in conjunction with a computer system, the computer-program product comprising a computer-readable storage medium and a computer-program mechanism embedded therein for generating an analysis equation in an EDA environment, comprising:
    instructions for displaying a first window in a GUI associated with the EDA environment, wherein the first window includes one or more graphical objects associated with a circuit design, and wherein the one or more graphical objects and associated electrical parameters are configured to be selected by a user using a first user-interface device;

instructions for displaying a second window in the GUI, wherein the second window includes analysis operations that can be selected by the user; and instructions for displaying a third window in the GUI, wherein the third window includes an equation editor;

instructions for receiving a selection of one or more graphical objects and associated electrical parameters from the user;

instructions for receiving a selection of an analysis operation from the user; and instructions for populating a symbolic representation of the analysis equation in the equation editor based on the selection of one or more graphical objects and associated electrical parameters and the selection of the analysis operation.

15. The computer-program product of claim 14, wherein the first user-interface device includes a mouse; and
wherein the given graphical object is selected by performing one or more mouse clicks proximate to the given graphical object.

16. The computer-program product of claim 15, wherein the electrical parameter is inferred based at least on a position of a cursor in the first window when the user selects the given graphical object.

17. The computer-program product of claim 14, wherein the second user-interface device includes a keyboard, which can be a physical keyboard or a virtual keyboard; and
wherein the one or more text entries are provided by the user by activating one or more icons or keys on the keyboard.

18. The computer-program product of claim 14, wherein the computer-program mechanism further includes displaying additional information if the user selects the given graphical object, wherein the additional information allows the user to select the electrical parameter associated with the given graphical object.

19. The computer-program product of claim 18, wherein the additional information is presented in a drop-down menu.

20. A computer system, comprising:
a processor;
memory; and
a program module, wherein the program module is stored in the memory and configured to be executed by the processor to generate an analysis equation in an EDA environment, the program module including:

instructions for displaying a first window in a GUI associated with the EDA environment, wherein the first window includes one or more graphical objects associated with a circuit design, and wherein the one or more graphical objects and associated electrical parameters are configured to be selected by a user using a first user-interface device;

instructions for displaying a second window in the GUI, wherein the second window includes analysis operations that can be selected by the user;

instructions for displaying a third window in the GUI, wherein the third window includes an equation editor;

instructions for receiving a selection of one or more graphical objects and associated electrical parameters from the user;

instructions for receiving a selection of an analysis operation from the user; and instructions for populating a symbolic representation of the analysis equation in the equation editor based on the selection of one or more graphical objects and associated electrical parameters and the selection of the analysis operation.

\* \* \* \* \*